United States Patent [19]

Nakayama et al.

[11] Patent Number: 4,979,286
[45] Date of Patent: Dec. 25, 1990

[54] ELECTRIC PARTS MOUNTING APPARATUS AND ELECTRIC PARTS MOUNTING METHOD

[75] Inventors: Susumu Nakayama, Shizuoka; Masato Itagaki; Keisuke Fujishiro, both of Shimizu, all of Japan

[73] Assignee: Hitachi, Ltd., Tokyo, Japan

[21] Appl. No.: 349,495

[22] Filed: May 9, 1989

[30] Foreign Application Priority Data

May 13, 1988 [JP] Japan .................................. 63-114671

[51] Int. Cl.$^5$ ............................................. B23P 19/00
[52] U.S. Cl. ....................................... 29/740; 29/743; 29/759; 29/834; 294/64.1
[58] Field of Search ................. 29/740, 743, 759, 834, 29/835, 836; 294/64.1

[56] References Cited

U.S. PATENT DOCUMENTS 3,887,998 6/1975 Hartleroad et al. ................... 29/740
4,780,956 11/1988 Pearson et al. ......................... 29/740

FOREIGN PATENT DOCUMENTS 177833 9/1985 Japan .................................. 294/64.1

OTHER PUBLICATIONS

Dunman, J. P. G., Vacuum Operated Pickup Probe, IBM Tech. Discl. Bull., vol. 12, No. 8, Jan. 1970.

Primary Examiner—P. W. Echols
Attorney, Agent, or Firm—Antonelli, Terry, Stout & Kraus

[57] ABSTRACT

An electric parts mounting apparatus is provided with a head rotation drive mechanism which is magnetically or fluidly connected to a vacuum head in a non-contact state. The vacuum heads are rotated by the head rotation drive mechanism, and the electric parts taken up by the vacuum heads are angularly positioned, and then mounted on the circuit board.

16 Claims, 13 Drawing Sheets

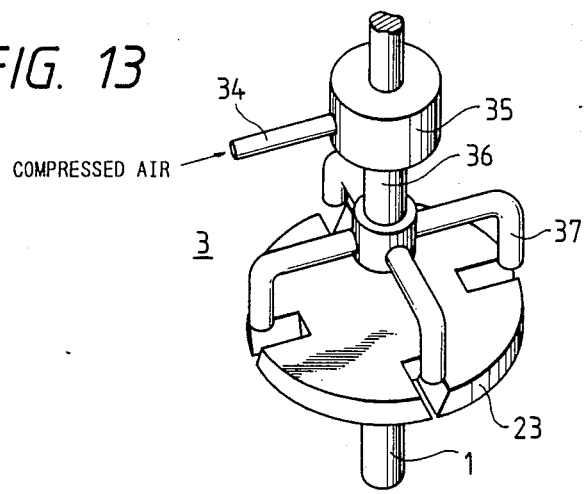
FIG. 13
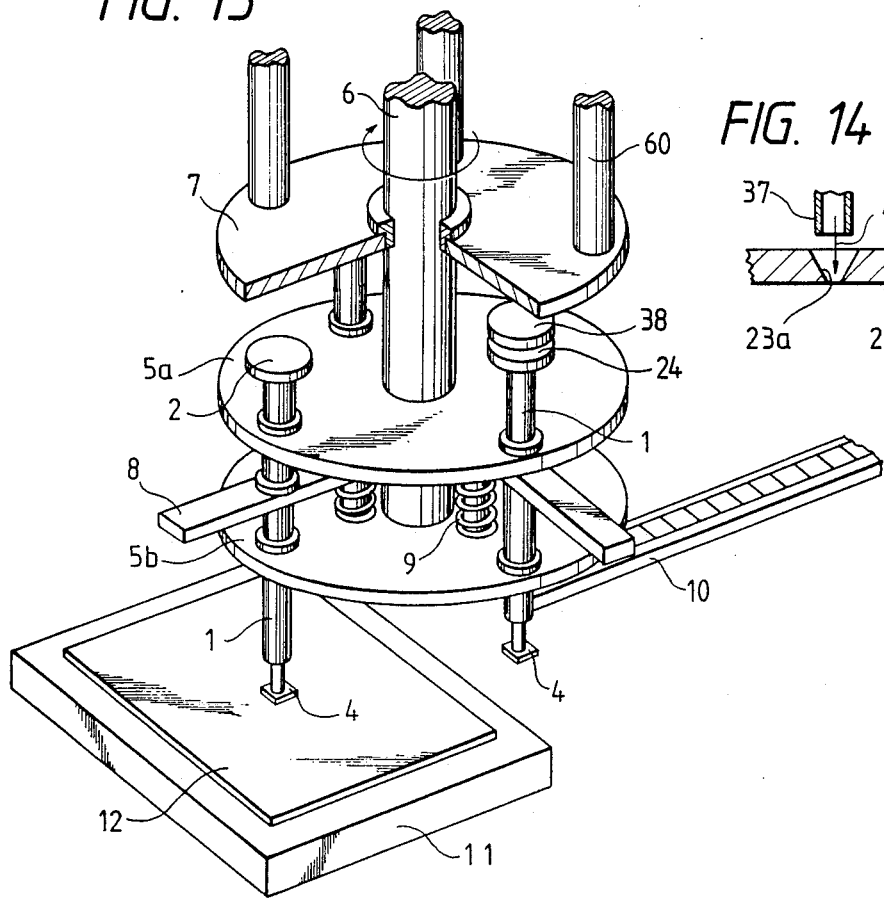
FIG. 15
FIG. 14

FIG. 22
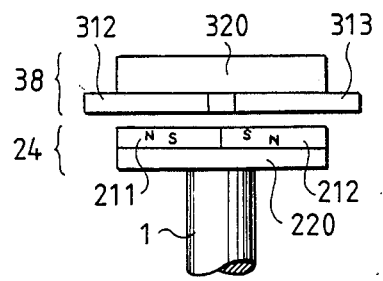
FIG. 23
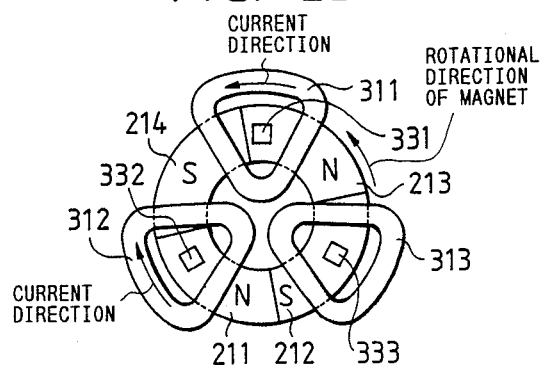
FIG. 24
LEFTWARD ROTATION OF ROTOR
| IC | | | CURRENT DIRECTION OF COIL | | |
|---|---|---|---|---|---|
| 331 | 332 | 333 | 311 | 312 | 313 |
| 1 | 1 | 0 | ↶ | ↷ | — |
| 1 | 0 | 0 | — | ↷ | ↶ |
| 1 | 0 | 1 | ↷ | — | ↶ |
| 0 | 0 | 1 | ↷ | ↶ | — |
| 0 | 1 | 1 | — | ↶ | ↷ |
| 0 | 1 | 0 | ↶ | — | ↷ |
1 : N - POLE    — : CURRENT OFF
0 : S - POLE

ELECTRIC PARTS MOUNTING APPARATUS AND ELECTRIC PARTS MOUNTING METHOD

BACKGROUND OF THE INVENTION

The present invention relates to an electric parts mounting apparatus and method for taking up and transferring electric parts by vacuum heads, and mounting the electric parts on a board such as a circuit board at a prescribed position and, more particularly, to a mechanism for rotating the vacuum heads and effecting angular positioning of the electric parts.

A conventional electric parts mounting apparatus of the above-mentioned type is disclosed in Japanese Patent Publication No. 62-13839/1987, wherein a driving means for rotating vacuum heads by a prescribed angle is provided out of a movement range of the vacuum heads, for example, the plurality of vacuum heads are mechanically connected to the driving means by a single timing belt so as to rotate on their own axes. Another example is disclosed in Japanese Patent Laid-Open No. 61-115387/1986, wherein a driving means and vacuum heads are connected through clutches so as to rotate the vacuum heads. Still another example is disclosed in Japanese Patent Laid-Open No. 61-168298/1986, wherein when a driven shaft is rotated a prescribed angle, with the driven shaft being positioned on an axis of a driving shaft and the driving shaft being lowered to engage with the driven shaft and transmit the rotation of the driving shaft to the driven shaft by frictional force. The driving shaft is raised after the completion of the rotation so that the driving shaft is disengaged from the driven shaft, and then the next step is taken.

Since the conventional apparatus has an operation transmitting system between the vacuum heads and the driving means, for example, in the apparatus, wherein the plurality of vacuum heads are connected to the driving means by the single timing belt to rotate the vacuum heads, a problem arises in that the vacuum heads are unnecessarily caused to rotate and angular rotation of the vacuum heads must be memorized in a control apparatus and corrected. Further, the apparatus, in which the driving means and the vacuum heads are connected through clutches to rotate the vacuum heads, a problem arises in that slip takes place due to wear and tear of the clutches. Further, since the conventional apparatus has a driving system for the vacuum heads disposed out of the movement range of the vacuum heads, a transmission mechanism such the timing belt, the clutches, etc. as becomes necessary, and provision of such a transmission mechanism results in increasing inertia moment of a vacuum head rotation system, and prevents a high speed rotation. Further, in the conventional apparatus in which the driven shaft (the vacuum head) is positioned at the position of the driving shaft, the driving shaft side is lowered to engage with the driven shaft, and the driving shaft is raised to disengage the driven shaft after the rotation of the driven shaft, when the plurality of driven shafts are respectively rotated by the prescribed angles, the Necessary time of lowering and raising the driving shaft side before and after the rotation of the driven shaft was a bar to a reduction of tact time of electric parts mounting apparatus.

With regard to a tact time, in a tact system wherein a process is divided into a plurality of steps to carry out the process, and each step is effected as in a production line method, a tact time represents a time allotted for one of the steps to carry out such step. For example, in a parts mounting apparatus, a tact time is provided to effect one step such as a picking up of a part, a positioning of the part, and a setting of the part on a substrate. The tact time in this case is a time allotted to the apparatus for carrying out the step.

SUMMARY OF THE INVENTION

An object of the invention is to provide an electric parts mounting apparatus which is capable of rotating each of a plurality of vacuum heads at a high speed a prescribed angle and which reduces the tact time for mounting electric parts.

Another object of the invention resides in providing an apparatus which directly and independently rotates each of a plurality of vacuum heads at a high speed by a prescribed angle.

In order to achieve the above-mentioned objects, an electric parts mounting apparatus according to the invention comprises vacuum heads for taking up electric parts from a feeder for electric parts and then mounting the electric parts on a parts support member such as a printed circuit board. A head holder rotatably supports each of the vacuum heads, with a rotation shaft being connected to the head holder to rotate the head holder. A mounting frame supports the rotation shaft. A head rotation drive mechanism has a driven member attached to the vacuum head on an opposite side thereof to the side taking up electric parts and a drive member is magnetically connected to the driven member with a small gap and rotated by a drive source.

The head rotation drive mechanism can be constructed such that the head rotation drive mechanism comprises a drive member of disk and a driven member of disk, with the drive member and the driven member each having, on a peripheral portion thereof, magnets arranged so that N pole and S pole appear alternatively with an equal pitch therebetween. The drive member and the driven member are arranged so that the outer peripheral portion of the driven member face the outer peripheral portion of the drive member with a small gap therebetween.

The magnetic coupling between the drive member and the driven member may be replaced by a fluid coupling.

Additionally, the head rotation drive mechanism may include an electric motor with motor rotor of the motor being the driven member and a stator of the motor being the drive member.

By the above construction, when one of the vacuum heads comes to a vacuum head rotation station, the driven member opposes the driving member, whereby the corresponding vacuum head can be rotated by magnetic force or fluid force by a prescribed angle. Since the driven member is provided in each of the vacuum heads, each of the vacuum heads can be rotated independently of the others at the vacuum head rotation station by a prescribed angle. Further, in the apparatus in which the rotor of the motor is directly attached to the vacuum head, the other rotation transmission mechanism can be omitted, so that inertia moment in a rotation system is small and a high rotational speed of the vacuum head on its own axis can be effected.

Further, by providing a brake for preventing rotation of the vacuum head on its own axis and stopping the rotation of the vacuum head except when necessary undesired rotation of the vacuum head on its axis can be prevented, whereby errors in angular positioning in the mounting of the electric parts on the circuit board are minimized.

Further, in the present invention, the driven member and the drive member are connected by using magnetic force or fluid force in a non-contact state, so that there is no frictional transmission part, and precise angle-positioning is possible by virtue of a preventing of a sliding between the drive and driven members. Furthermore, by virtue of the non-contact coupling it is unnecessary to move the drive member side to engage with and disengage the driven member and, consequently tact time for mounting the electric parts can be reduced by a time period of the engagement and disengagement operation.

Another feature of the invention is in an electric parts mounting method which includes the steps of preparing vacuum heads for taking up electric parts from a feeder for parts and then mounting the electric parts on a parts support member, preparing a head holder for rotatably supporting the vacuum heads, preparing a rotation shaft for rotating the head holder, preparing a mounting frame for supporting the rotation shaft, providing driven members to be driven connected to the vacuum heads, respectively, on an opposite side of the vacuum head to the side taking up the electric parts and a drive member magnetically coupled to the driven member with a small gap therebetween, rotating the vacuum head relative to the head holder by rotating the drive member to effect angular positioning of the electric parts, and then mounting the electric parts on the parts support member.

Another feature of the present invention resides in an electric part mounting method of taking up electric parts from a feeder for parts by take-up heads, magnetically coupling a drive member with one of the take-up heads with a small gap therebetween, rotating the take-up head by the drive member to effect angular positioning of the electric part taken up by the take-up head, and then mounting the electric part on a parts supporter.

Another feature of the invention resides in a vacuum head rotation drive mechanism for an electric parts mounting apparatus, which mechanism comprises a driven member to be driven attached to a vacuum head which takes up electric parts and then mount them on a parts supporter, a driving member magnetically connected to the driven member with a small gap therebetween and rotated by a drive source.

Other features, objects and advantages of the present invention will be apparent from the following description in accordance with the accompanying drawings.

BRIEF DESCRIPTION OF THE DRAWINGS

FIGS. 13 and 14 illustrate another embodiment of a head rotation drive mechanism, wherein FIG. 13 is a perspective view of the head rotation drive mechanism;

FIG. 14 is a sectional view of a part of the mechanism shown in FIG. 13;

FIG. 15 is a perspective view of the parts mounting apparatus;

FIG. 22 is a front view of another concrete example of the rotating motor for rotating the parts vacuum head on its own axis;

FIG. 23 is a plane view of the motor shown in FIG. 22 for showing an arrangement of coils and magnets;

FIG. 24 is a chart showing an operational pattern of FIG. 23;

DESCRIPTION OF THE INVENTION

Figure 1:
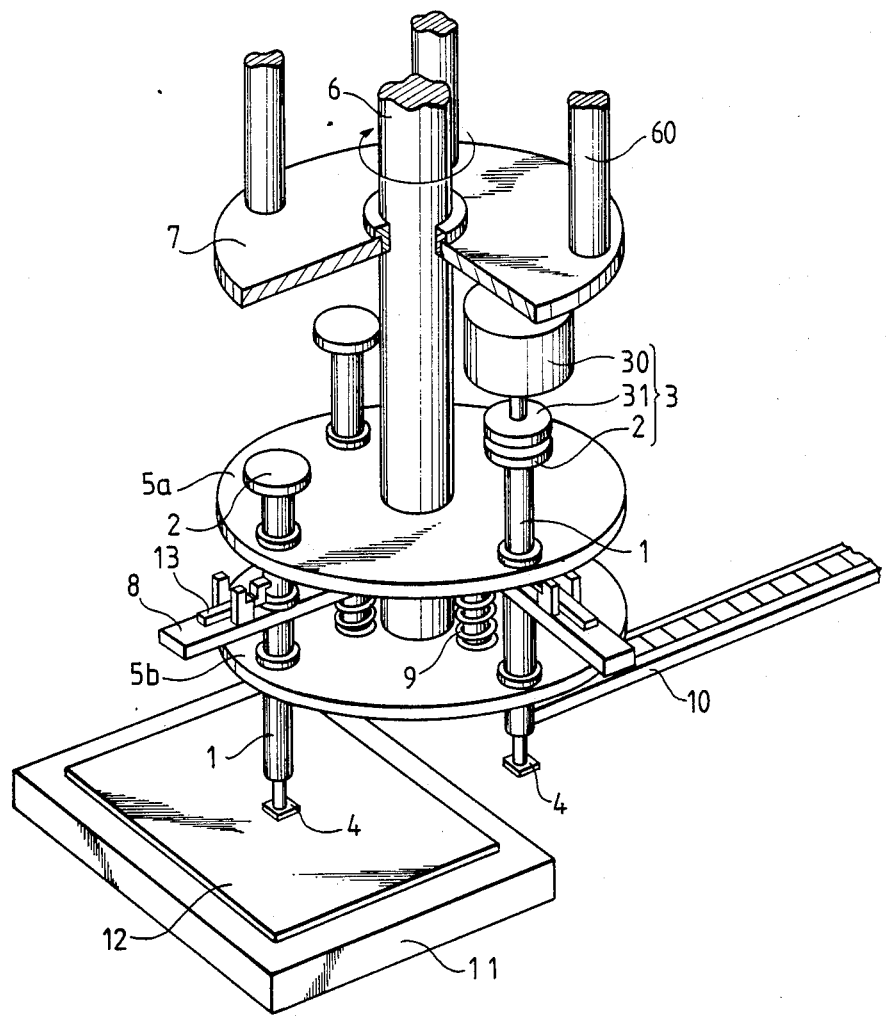
FIG. 1 is a perspective view of the electric parts mounting apparatus.
Figure 2:
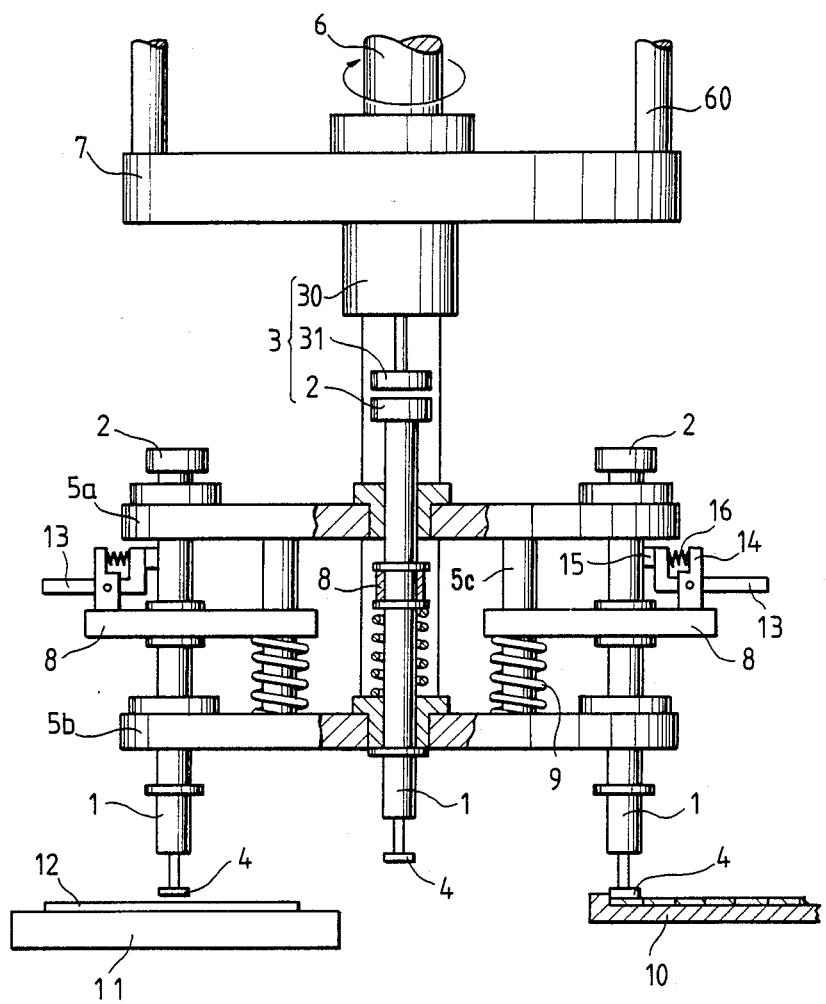
FIG. 2 is a vertical sectional view of the electric parts mounting apparatus shown in FIG. 1.

In FIGS. 1 and 2, four vacuum heads 1 are rotatably and vertically slidably supported by a peripheral portion of each rotating disks (head holder) 5a, 5b. Each vacuum head 1 is always pressed upward by a lever 8 slidably fitted to a guide bar 5c mechanically connecting the rotating disks 5a, 5b, and a spring 9 acting on the lever 8. The lever 8 has a support member 14 secured thereto and a braking device including a rotatably supported brake lever 13 for stopping a rotation of the vacuum head 1 on its own axis. The is rotatably supported. The brake lever 13 has a frictional member 15 on the side of the vacuum head 1, and the frictional member 15 is pressed on the vacuum head 1 by a brake spring 16.

The rotating disks 5a, 5b are intermittently positioned at ¼ revolution by a rotation shaft 6. A driven member 2 including a plurality of magnet pieces is mounted at an upper end of the vacuum head 1. Electric parts 4 are respectively sequentially conveyed by a parts feeder 10. A head rotation drive mechanism 3, which comprising a motor 30 and a drive member 31 (magnet pieces) is so arranged that the head rotation drive mechanism 3 is positioned over the vacuum head 1 when the vacuum head 1 over the feeder 10 is rotated a ¼ revolution by the shaft 6. The motor 30 and drive member 31 of the drive mechanism 3 are mounted on a mounting frame 7 so that the magnet piece 31 does not contact the magnet piece of the driven member 2. The vacuum head 1 positioned at the drive mechanism 3 is shifted to a position over a parts support or circuit board 12 mounted on an XY table 11 when the vacuum head 1 is further rotated by a ¼ revolution by the shaft 6.

The vacuum head 1 over the feeder 10, lowered by pressing the lever 8 in a downward direction, takes up and raises a part 4. The rotating disks 5a, 5b are then rotated by a ¼ revolution by the shaft 6, whereby the vacuum head 1 also is rotated and positioned below the head rotation drive mechanism 3, so that the axis of the head rotation drive mechanism 3 is aligned with the axis of the vacuum head 1.

Then, the brake lever 13 is pressed down to release the brake, so that the vacuum head 1 will be rotatable relative to the rotating disks 5a, 5b. The magnet piece 31 and the magnet piece of the driven member 2 form a non-contact magnetic coupling, whereby the vacuum head 1 can be rotated by rotating the motor 30 by a prescribed angle to effect angular positioning of the electric part 4. Next, the brake lever 13 is raised to brake the vacuum head 1 to prevent the vacuum head 1 from rotating on its own axis. Then, the rotating disks 5a, 5b are further rotated by ¼ revolution by the shaft to position the vacuum head 1 over the board 12. The board 12 is disposed on the XY table 11, and the board 12 is positioned by the XY table 11 in a manner such that an electric part mounting position on the board 12 will coincide with a position of the electric part 4 conveyed by the vacuum head 1. Next, the vacuum head 1 is pressed down by the lever 8, the electric part 4 taken up by the vacuum head 1 is disposed on the board 12, and then the vacuum head 1 is raised. Further, when the magnet piece of the driven member 2 on the upper end of the vacuum head 1 comes in opposition to the magnet piece of the drive member 31 on the mounting frame side, the opposite magnetic poles are necessary to be opposite in magnetic polarity to each other so that these magnet pieces of the driven and drive member 2, 31 attract each other. Therefore, while the rotating a disks 5a, 5b is rotating ¼ revolution, that is in a time period from a time a certain one of the vacuum heads 1 is separated from the position of the head rotation drive mechanism 3 until a time another vacuum head 1 comes to the position of the drive mechanism 3, the motor 30 is rotated and the magnet piece of the drive member 31 is rotated so that its pole will be opposite in magnetic polarity to the nest magnet piece of the drive member 2 to come to the drive mechanism 3, whereby the magnet pieces of the driven and drive members 2, 31 are ready to attract each other any time when the magnetic pieces come near to each other.

By repeating the above-mentioned operation, the electric parts 4 can be automatically mounted on the board 12 at a prescribed position and a prescribed angle.

Figure 3:
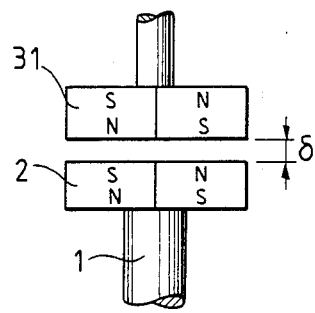
FIG. 3 is a front view of a head rotation drive mechanism shown in FIG. 1.
Figure 4:
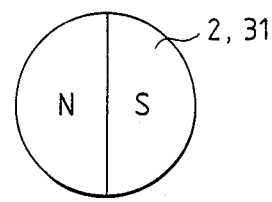
FIG. 4 is a plane view of magnetic pieces shown in FIG. 3.

As shown in FIGS. 3 and 4, two-pole magnets of disk-shape, in the thickness direction, are arranged so that opposite faces of the two magnets will be opposite in magnetic polarity to each other, and opposed with a gap δ therebetween. With this construction, when the motor 30 is rotated, the vacuum head 1 can be rotated through magnetic force.

Figure 5:
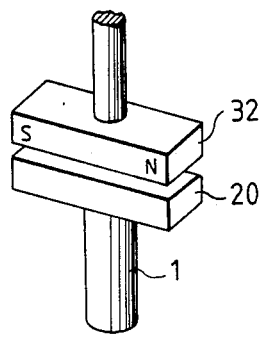
FIG. 5 is a perspective view of another example of the head rotation drive mechanism.

The rotation transmission mechanism of FIG. 5 includes a bar-shaped magnetic member 20 ferromagnetic member) mounted on the upper end of the vacuum head 1, and a bar magnet 32 provided in place of the disk-shaped magnet piece of the drive member 31 which constructs the head rotation drive mechanism 3. The bar-shaped magnetic member 20 and the bar magnet 32 each are attached so that the length directions thereof cross the rotation axis at right angles. The bar magnet 32 is rotated, so that the magnetic member 20 attracted by magnetic force also is rotated, and the rotation is transmitted to the vacuum head 1. In this construction, the magnet is used only on the drive side, so that the cost can be reduced. Further, by providing the bar magnet on the side of the vacuum head 1, and the magnetic member on the side of the mounting frame 7, the rotation can be transmitted, too. This construction is effective where a plurality of drive shafts are provided and the number of the driven shafts is few.

Figure 6:
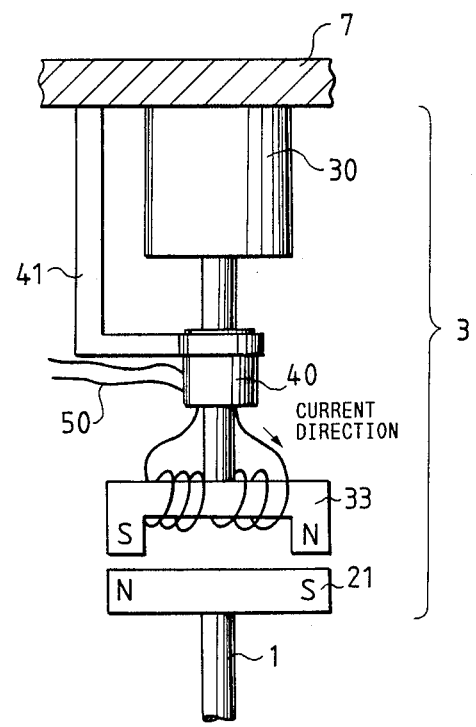
FIGS. 6, 7, 8, 9a and 9b each are a front view of another example of the head rotation drive mechanism.

The rotation drive mechanism of FIG. 6 is constructed such that the rotation of the motor 30 of the head rotation drive mechanism 3 is transmitted to the vacuum head 1 by using an electromagnet 33.

A bar magnet 21 is mounted on the upper end of the vacuum head 1. When the axis of the vacuum head 1 is aligned with the axis of the head rotation drive mechanism 3, a current flows in a direction of the arrow in FIG. 6 in a coil of the electromagnet 33, so that the electromagnet 33 and the bar magnet 21 are magnetically coupled while holding a constant gap therebetween, and the rotation of the motor 30 can be transmitted to the vacuum head 1. Current is supplied to the electromagnet 33 by lead wires 50 through a slip ring 40 provided between the motor 30 and the electromagnet 33. The slip ring 40 is provided with a rotation-stopper 41 for preventing rotation of the outer peripheral portion of the slip ring 40. According to this example, the electromagnet 33 can generate magnetic force proportional to current and a coupling force stronger than coupling force generated between permanent magnets can be produced.

Further, a combination produced by exchanging the positions of the electromagnet 33 and the bar magnet 21 with respect to each other also achieves the same effect. In this case it is necessary to provide both the rotation shaft 6 and the vacuum head 1 with slip rings and current is supplied to the electromagnet 33 through the each slip rings. In the rotation transmission mechanism of FIG. 7, a bar-shaped magnetic member (ferromagnetic member) 20 is attached in place of the bar magnet 21 mounted on the upper end of the vacuum head 1. By applying electric current into the electromagnet 33, the electromagnet 33 and the magnetic member 20 can be coupled by magnetic force in the same manner as the example in FIG. 5. In case of combination of the electromagnet and the permanent magnet, relative movement of them causes the coil of the electromagnet to generate counter electromotive force which acts to prevent their relative movement. However, in the combination of the electromagnet and the magnetic member as in this example, the above-mentioned force is not generated so that smooth relative movement is effected. Since no magnet is provided, cost is reduced more than in the example of FIG. 6. Further, a combination obtained by exchanging the electromagnet 33 and the magnetic member 20, that is, by providing the electromagnet 33 on the vacuum head side and the magnetic member 20 on the drive mechanism side, also can obtain the same effect.

Figure 8:
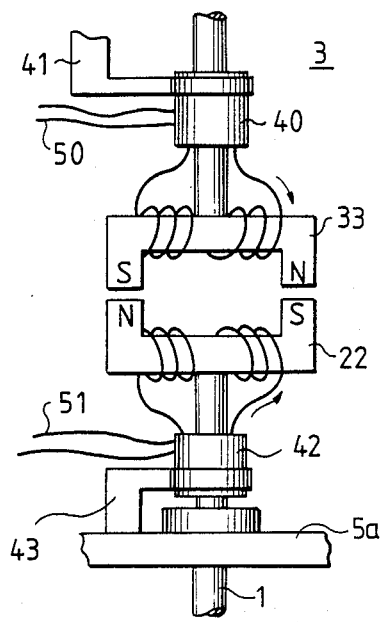

In the rotation transmission mechanism of FIG. 8, an electromagnet 22 is mounted, in place of the bar magnet 21, on the upper end of the vacuum head 1 of FIG. 6. Electric current is supplied to the electromagnet 22 by lead wires 51 through a slip ring 42. Another slip ring is mounted on the rotation shaft with the electric current being supplied to the lead wires 51 through the slip ring 42. The slip ring 42 has a rotation-stopper 43 attached thereto so as to prevent the rotation of the peripheral portion of the slip ring 42 relative to the rotating disk 5a.

When the axes of the head rotation drive mechanism 3 and the vacuum head 1 are aligned with each other, electric current is supplied to both the electromagnets 22, 33 in directions of the arrows in FIG. 8, whereby both the electromagnets 22, 33 are coupled by magnetic force, and the rotation of the motor 30 can be transmitted to the vacuum head 1. Even if the electric current supply to the electromagnets 22, 33 has been started before the alignment operation between the drive mechanism 3 and the vacuum head 1, a similar coupling to one between permanent magnets is formed. According to this example, the coupling is formed between the electromagnets 22, 23, so that a magnetic coupling force stronger than in any of the above-mentioned examples can be obtained.

Figure 7:
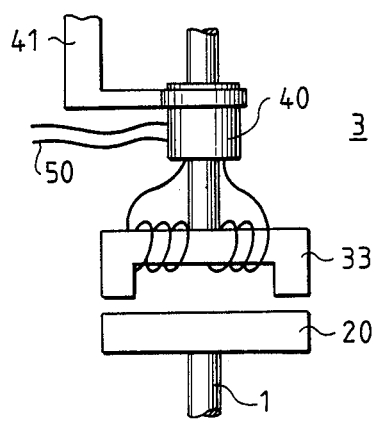
Figure 9A:
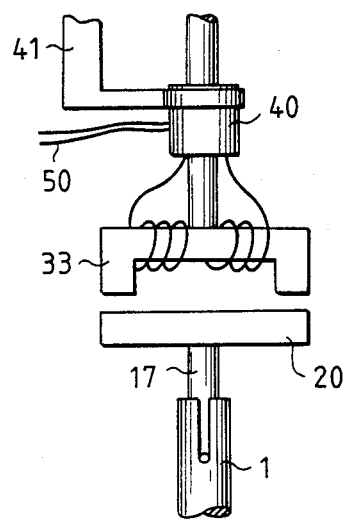
Figure 9B:
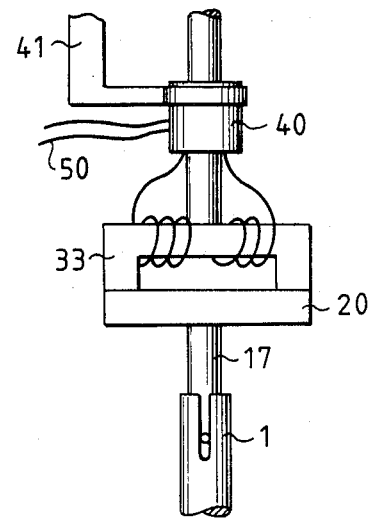

In FIGS. 9a and 9b, although the basic construction of the rotation transmission mechanism is the same as the example of FIG. 7, in this example, the magnetic member 20 is mounted axially slidably on the vacuum head by a slide shaft 17.

When the axes of the drive mechanism 3 and the vacuum head 1 are aligned as shown in FIG. 9a, electric current flows into the electromagnet 33, whereby the magnetic member 20 is raised by a magnetic force to contact with the electromagnet 33 as shown in FIG. 9b. Accordingly, the rotation of the motor 30 is transmitted to the vacuum head 1 by magnetic force and frictional force. According to this example, both the electromagnets are contacted and coupled, whereby transmission delay does not take place. Further, by this example, large drive force can be obtained and any mechanical drive means is unnecessary for connecting the drive member and the driven member.

Figure 10:
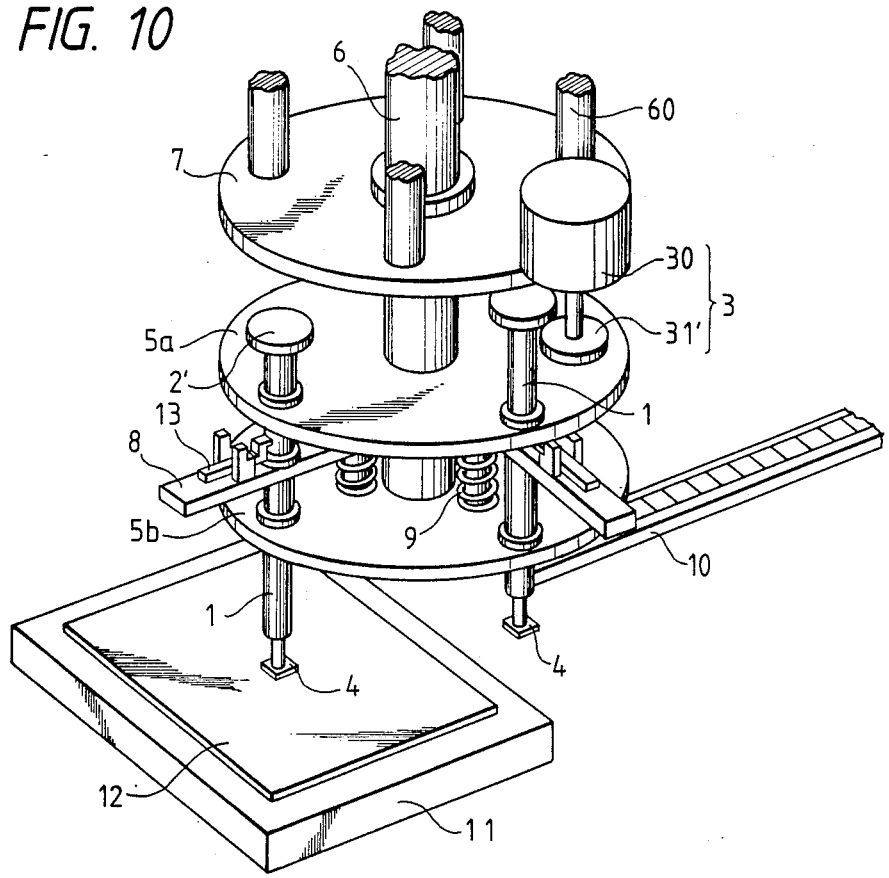
FIG. 10 is a perspective view of a parts mounting apparatus.
Figure 11:
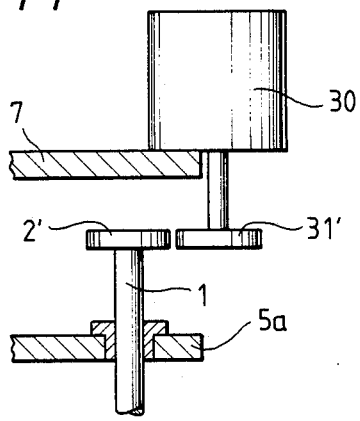
FIG. 11 is a side view of a head rotation drive mechanism shown in FIG. 10.
Figure 12:
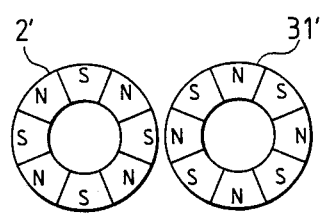
FIG. 12 is a plane view of magnetic pieces 2' and 31' shown in FIG. 11.
Figure 16:
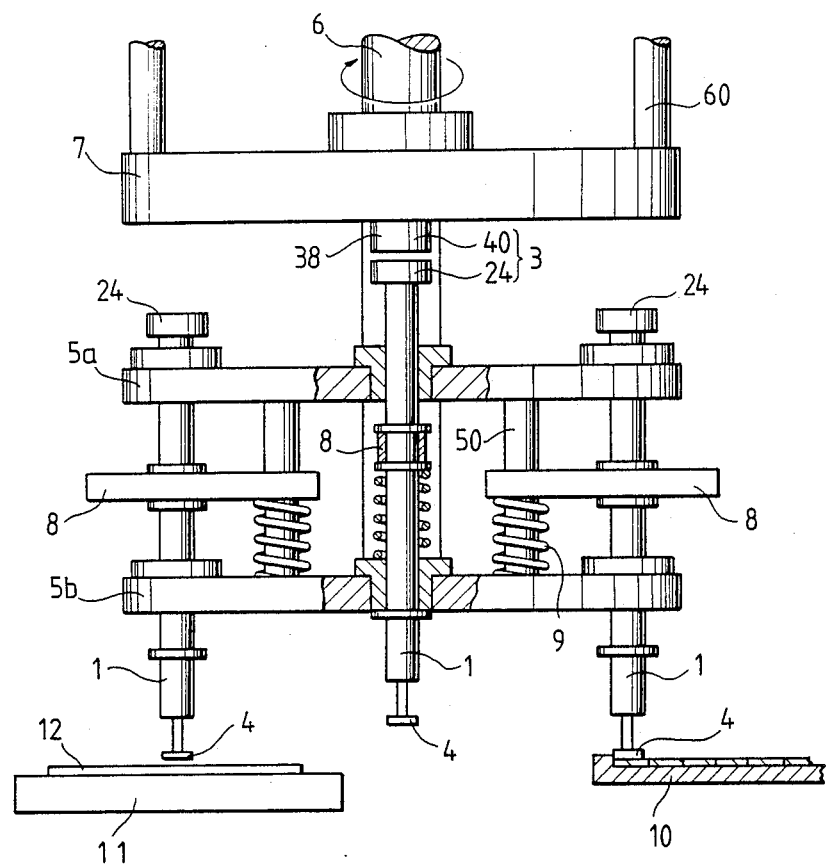
FIG. 16 is a vertical sectional view of the parts mounting apparatus shown in FIG. 15.

In FIG. 10, the head rotation drive mechanism 3 is slightly deviated outside from the axis of the vacuum head as shown in FIG. 11 and mounted on the mounting frame in the state that the peripheral portions of magnet pieces of the driven and drive members 2' and 31' are opposed to each other. Outer peripheral portions of the magnet pieces 2' and 31' each are divided into 8 sections which are equal to each other, as shown in FIG. 12, and S poles and N poles are arranged alternately. Therefore, the head rotation drive mechanism 3 and the vacuum head 1 are coupled at the peripheral portions of the magnet pieces of the driven and drive members 2' and 31', and the rotation of the motor 30 is transmitted to the vacuum head 1. Namely, the rotation is transmitted by a similar action to spur gears. Since a rotational direction of the motor 30 is inverse to one of the vacuum head 1, an instruction is given to the motor 30 to rotate, taking the rotational direction into consideration. This example is effective when any sufficient space can not be utilized over the vacuum head 1.

In FIGS. 13 and 14, four nozzles 37 are provided below the motor (not shown) of the head rotation drive mechanism. Compression air from a piping 34 is supplied to a rotary joint 35, and then to the four nozzles 37 through a piping 36 and the air is jetted from the lower ends of the nozzles 37. The rotary joint 35 corresponds to a slip ring in electric apparatus, the shaft of the motor 30 is sealingly slidably inserted in the rotary joint 35 and joined to the piping 36 sealingly and rotatably inserted in the rotary joint 35. When the motor shaft is rotated, the piping 36 and nozzles 37 also rotate; however, the piping 34 prevents the rotation of the rotary joint 35. A guide plate 23 is attached on an upper end of the vacuum head 1, with the guide plate 23 including wedge-shaped grooves 23a formed at positions opposing the nozzles 37 as shown most clearly in FIG. 14. By jetting air from the nozzles 37 to the wedge-shaped groove 23a of the guide plate 23, fluid force acts on the guide plate 23 so that the center of the wedge-shaped groove 23a of the guide plate 23 will be positioned at the center of the nozzle 37, whereby the vacuum head 1 is connected to the drive mechanism 3 by fluid force. Since this example does not use magnetic force as in the previous examples, but employs fluid force to connect both the shafts, in case where the magnetic force can not be used for the coupling of the shafts, for example, in a magnet manufacturing factory in which considerably magnetic powder is present in the environment, this example is suitable to be used as a parts mounting apparatus.

As shown in FIGS. 15 to 26a and 26b, a rotor 24 of a motor is attached to an upper end of each of the vacuum heads 1, and electric parts 4 are sequentially transferred by the feeder 10. A stator 38 of the motor, is attached to the mounting frame 7 over the vacuum head 1 which is disposed at a position such that the rotating disks 5a, 5b is rotated an angle of 90° from a position of the vacuum head 1 over the feeder 10. The mounting frame 7 is fixedly mounted by supporting bars 60. A circuit board 12 is mounted on the XY table 11 below the vacuum head 1 disposed at a position such that the rotating disks 5a, 5b are further rotated an angle of 90° from the above-mentioned position.

The vacuum head 1, disposed at a position (mounting station) over the feeder 10, is lowered by pressing down a lever 8 by a mechanism (not shown), takes up an electric part 4 and is then raised. Then, the rotating disks 5a, 5b are rotated an angle of 90° by the shaft so that each of the vacuum heads 1 are rotatably positioned by an angle of 90° around the shaft 6. At this position (vacuum head rotation station), the stator 38 and the rotor 24 which is attached to the upper end of the vacuum head 1 holding an electric part 4 are opposed to each other in a non-contact state. The electric part 4 is angularly positioned by rotating the vacuum head 1 a prescribed angle by the motor. After that, the vacuum head 1 is rotated by a 90° angle about the shaft 6 from the vacuum head rotation station as the rotating disks 5a, 5b rotate, and reaches to a position (mounting station) over the circuit board 12. At this time, the circuit board 12 is positioned by the XY table 11 so that the electric part mounting position and the position of the electric part 4 conveyed by the vacuum head 1 will coincide. When the circuit board 12 is positioned, the vacuum head is pressed down by the lever 8, the electric part 4 held by the vacuum head 1 is disposed on the circuit board 12 and the vacuum head 1 is raised. By repeating this operation, the electric parts 4 can be automatically mounted on the circuit board 12 at prescribed positions at prescribed angles.

Figure 17:
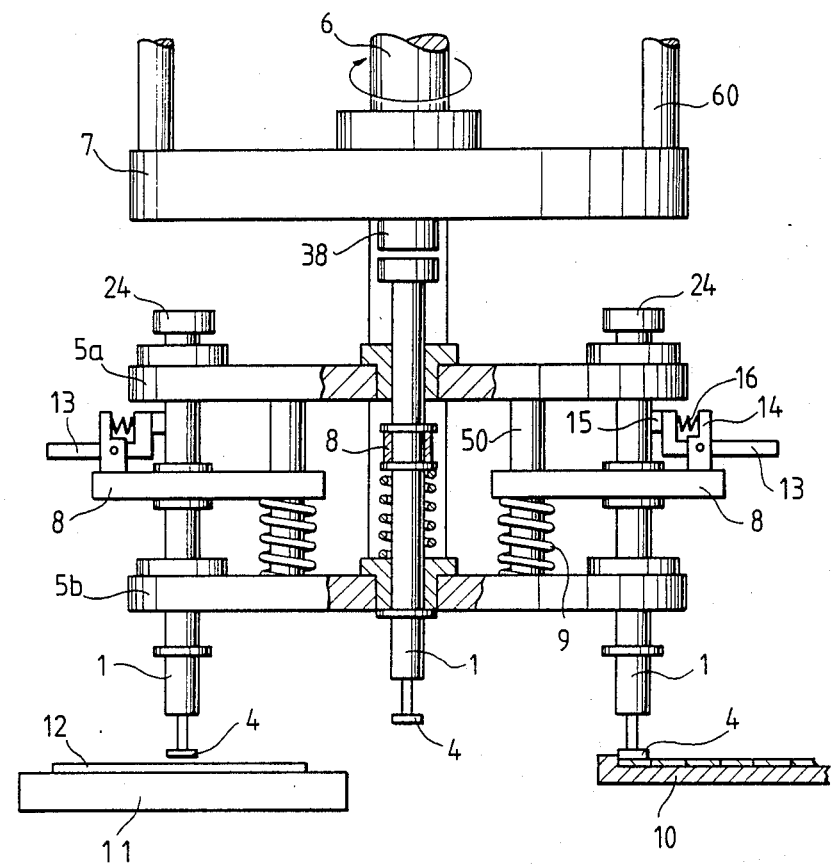
FIG. 17 is a sectional view of an example of an electric parts mounting apparatus provided with a vacuum head rotation prevention brake.

As shown in FIG. 17, a brake mechanism is provided comprising a brake lever 13, a support 14, a spring for brake 16, and a frictional member 15. In this case, when the vacuum head 1 reaches to a position that the stator is provided, the lever for brake 13 is pressed down at an opposite side thereof to a vacuum head side by the mechanism (not shown) whereby the frictional member 15 releases the vacuum head 1, and then the vacuum head 1 is rotated a prescribed rotation angle by the stator 38 and the rotor 24. After the rotation is finished, the brake 13 is released, whereby the frictional member 15 is pressed on the vacuum head 1 again. In this manner, the frictional member 15 is pressed on the vacuum head 1 except for the time the vacuum head 1 is rotated, whereby rotation of the vacuum head 1 on its own axis, etc. which may be caused by vibration, etc. is prevented thereby ensuring a precise angular position for mounting of the electric part.

Figure 18:
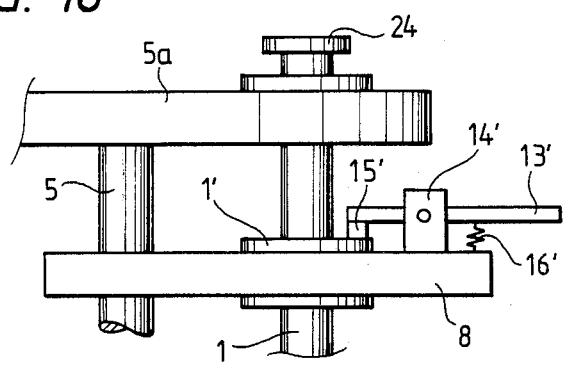
FIG. 18 is a side view of another example of the vacuum head rotation prevention brake.

The brake mechanism of FIG. 18 includes a frictional member 15' at the end portion of a brake lever 13' pivotably supported on a support 14' fixed to the lever 8, with the frictional member 15' being pressed on a flange 1' attached to the vacuum head 1 by a spring 16' to providing a brake force, and with the brake action being released by pressing down the other end of the brake lever 13'.

Figure 19:
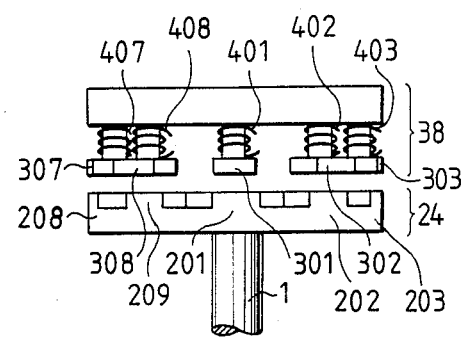
FIG. 19 is a front view of a concrete example of a rotating motor for rotating the parts vacuum head.
Figure 20:
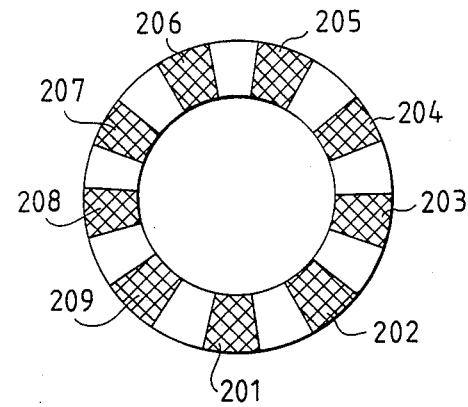
FIG. 20 is a plane view of a rotor shown in FIG. 19.
Figure 21:
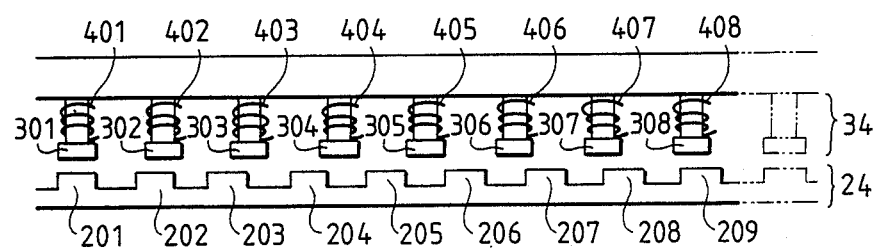
FIG. 21 is a development view of FIG. 20.

As shown in FIGS. 19-21, the rotor 24 has nine rotating magnetic teeth 201 to 209 arranged with an angular pitch of 40°. The stator 38 which opposes the rotor 24 in a non-contact state, comprises eight fixed magnetic pole teeth 301 to 308 and coils 401 to 408 wound on the fixed magnetic pole teeth, respectively. The fixed magnetic pole teeth are provided at a pitch of 45° angle.

FIG. 21 shows a state that the fixed magnetic pole teeth 301 and, the rotor magnetic pole teeth 201 are attracted each other, with the coil 401 being supplied with electric current. Next, when the supply of current to the coil 401 is interrupted and electric current is applied to the coil 402, the fixed magnetic pole teeth 302 and the rotor magnetic pole teeth 202 are attracted to each other, and the rotor 24 is rotated rightward an angle of 45°. When electric current is supplied to the coils in the reverse order, the rotor 24 can be rotated in the reverse direction.

As shown in FIGS. 22-24, rotor 24 comprises four magnets 211 to 214 and a rotating yoke 220, with the magnets 211 to 214 being magnetized in a thickness direction and arranged in a ring state so that adjacent magnets have an opposite polarity. A stator 38, disposed in opposition to and in a non-contact state with the rotor 24, comprises three coils 311 to 313 and three entire or complete ICs 331 to 333 each fixed to the yoke 320. The IC detects output "1" or output "0" by orientation of a magnetic field in which the IC is disposed. When the magnets 211 to 214, the coils 311 to 313 and the ICs 331 to 333 are disposed at positions as shown in FIG. 24, leftward rotation torque is applied on the magnets 211 to 214 according to the Fleming's left hand law by applying electric current to the coil 311 and the coil 312, and the rotor 24 rotates leftward as shown in FIG. 23. Selection of coil to be supplied with electric current is effected by detecting the position of magnet by the IC. An example of coil selection and electric current direction in case where the rotor 24 is rotated leftwards is shown in FIG. 24. "Electric current direction of the coil" in FIG. 24 is a direction seen in FIG. 23. When the current direction is reversed to the direction shown in FIG. 24, the rotor rotates rightwards. Further, a prescribed angle rotation of the rotor 24 is effected by a servo motor control method of providing the vacuum head 1 with an encoder (not shown), detecting the rotation angle, feeding the signal back to a motor controller (not shown) and adjusting an electric current value.

Figure 25:
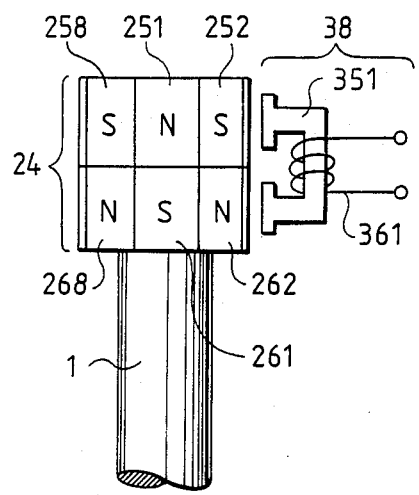
FIG. 25 is a front view of another example of the motor for rotating the parts vacuum head.

In FIGS. 25 and 26, the rotor 24 is constructed by annularly arranging eight magnets 251 to 258 magnetized in the thickness direction so that adjacent magnets will be opposite in magnetic pole, and further annularly arranging eight magnets 261 to 268 below the magnets 251 to 258 so that the upper magnets 251 to 258 are opposite in magnetic pole to the lower magnets 261 to 268. The stator 38 is constructed by arranging two U-shaped magnetic poles 351, 352 so that an end portion of each of the magnetic poles 351, 352 oppose the upper and lower magnets of the rotor 24 in a non-contact state, and deviating the magnetic poles 351, 352 relative to rotation axis of the rotor 24 by an angle of 22.5°.

Figure 26A:
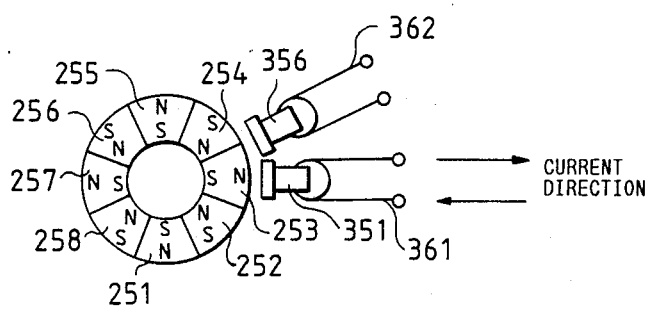
FIGS. 26a and 26b each are a plane view of FIG. 25.
Figure 26B:
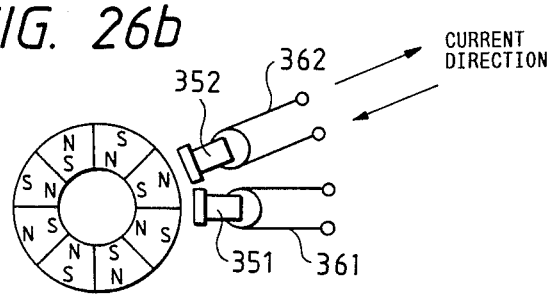

The magnetic poles 351, 352 each have a coil 361, 362 wound thereon in the same direction. FIG. 26a shows a position of the rotor 24 when electric current is applied to the coil 361. Next, when electric current to the coil 361 is interrupted and electric current is applied to the coil 362 in a direction shown in FIG. 26(b), the rotor 24 is rotated leftward by an angle of 22.5° and is stopped. In this manner, by switching the flow of electric current to the coils 361, 362 the rotor 24 can be selectively rotated in angular increments of of 22.5°. It also is possible to rotate the rotor 24 in a reverse direction. In the example shown in FIGS. 25 and 26a and 26b, it is possible to provide the rotor not on the upper but in the middle of the vacuum head 1.

This embodiment is of a rotation system of direct drive type which is provided with the rotor of the rotating motor on the vacuum head, so that a rotation transmission mechanism is unnecessary as a result an inertia moment by the amount corresponding to the mechanism is reduced, and the vacuum head can be rotated at a high speed.

Figure 27:
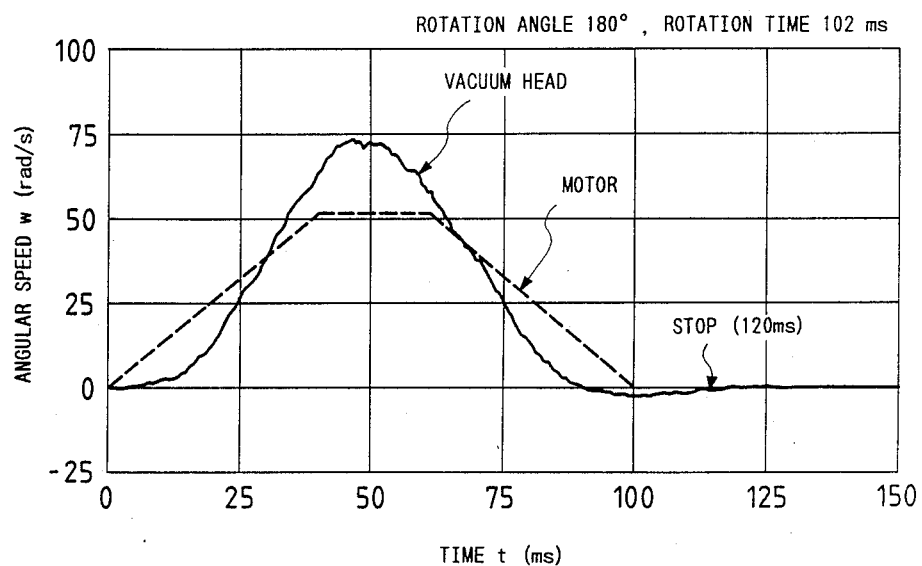
FIG. 27 is a graphical illustration for explaining follow up characteristics of the vacuum head with respect to the rotation of the motor.

The follow-up characteristics of the vacuum head 1 to the rotation of the motor 30 in the rotation transmission mechanism by the magnetic coupling of FIGS. 1 to 4 are graphically illustrated in FIG. 27, wherein a dotted line represents a change of angular speed w to time t when the motor 30 is rotated an angle of 180° in a time period of 102ms, and a solid line represents an angular speed at a time t when the vacuum head 1 rotates the rotation of the motor 30. As shown in FIG. 27, the vacuum head 1 can follow the rotation of the motor 30 with a very slight time delay, and the vacuum head 1 can be rotated an angle of 180° in a period of time of 120ms.

Figure 28A:
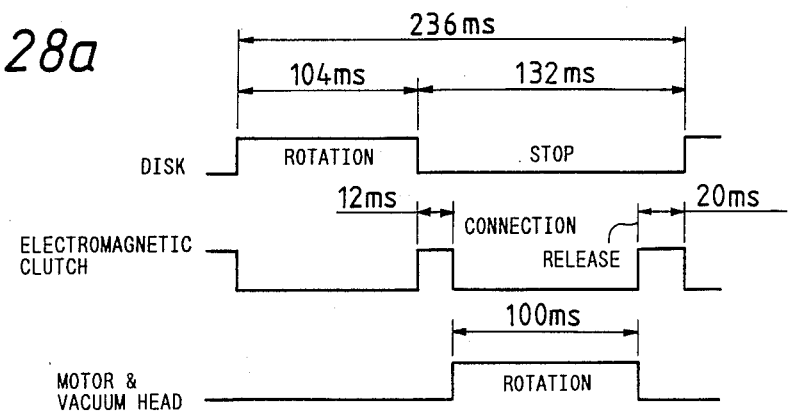
FIGS. 28a, 28b and 28c each are an example of a time chart when the vacuum head is rotated by the head rotation drive mechanism.
Figure 28B:
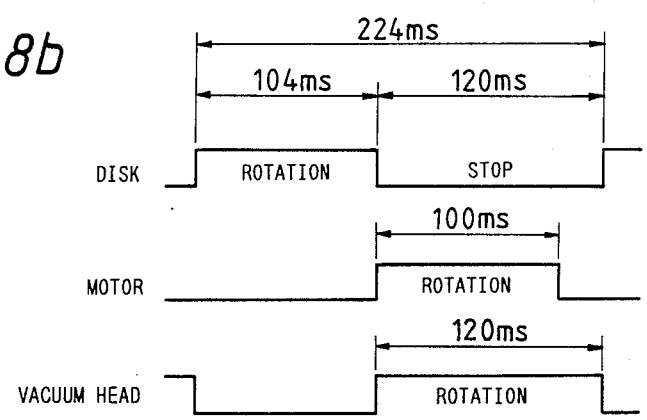
Figure 28C:
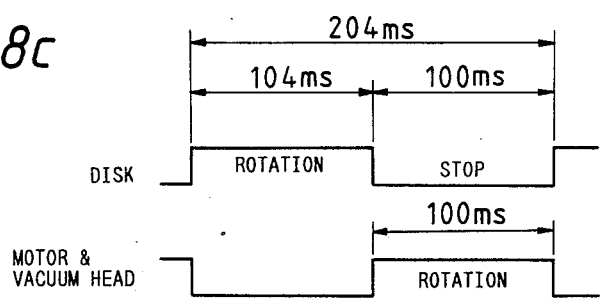

FIGS. 28a to 28c show an example of time chart when the vacuum head is rotated by the head rotation drive mechanism. FIG. 28a shows a time chart of the head rotation drive mechanism shown in FIG. 9, FIG. 28b a time chart of the head rotation drive mechanism shown in FIG. 3 and FIG. 4, and FIG. 28c a time chart of the head rotation drive mechanism shown in FIGS. 19 to 21.

According to the present invention, only the vacuum head which reached to the head rotation drive mechanism can be rotated a prescribed angle independently of the vacuum heads. Further, a driving means for rotating the vacuum heads experiences no problems with regard to friction because it has no frictional transmission part, and errors in angle caused by a sliding action do not occurs, except for the example shown in FIG. 9. Further, since the drive side and driven side of the vacuum head are coupled in non-contact state, special operation for connection and disconnection between the drive side and the driven side is unnecessary. As a result, time required to rotate the vacuum head by a prescribed angle can be reduced, and a tact time of the electric parts mounting apparatus also can be reduced.

What is claimed is:

1. An electric parts mounting apparatus comprising a plurality of vacuum heads means for respectively taking up an electric part from a parts feeder and mounting said electric part on a parts support, a head holder means for rotatably supporting said plurality of vacuum head means, a rotation shaft means secured to said head holder means for rotating said head holder means, a mounting frame means for supporting said rotation shaft means, and a head rotation drive mechanism for rotating said vacuum head means including a driven member mounted on each of said vacuum head means on a side thereof opposite to a side thereof taking up said electric parts, and a drive member magnetically connected to said driven member with a small gap therebetween and rotated by a drive source.

2. An electric parts mounting apparatus according to claim 1, wherein a brake mechanism for preventing each of said vacuum head means from rotating on its own axis is provided around each of said vacuum head means.

3. An electric parts mounting apparatus comprising a plurality of vacuum head means for respectively taking up an electric part from a parts feeder and mounting said electric parts on a parts support, a head holder means for rotatably supporting said plurality of vacuum head means, a rotation shaft means secured to said head holder means for rotating said head holder means, a mounting frame means for supporting said rotation shaft means, and a head rotation drive mechanism for rotating said vacuum head means including a magnetic member mounted on each of said vacuum head means on an opposite side thereof to a side thereof for taking up said electric parts so as to be slidable on said vacuum head means in an axial direction thereof and engaged with said vacuum head means in a rotational direction thereof, and an electromagnet disposed in opposition to said magnetic member with a gap therebetween and rotated by a drive source, and wherein said head rotation drive mechanism attracts said magnetic member by magnetizing said electromagnet and rotates said vacuum head means by said drive source.

4. An electric parts mounting apparatus comprising a plurality of vacuum head means for taking up an electric part from a parts feeder and mounting said electric part on a parts support, a head holder means for rotatably supporting said plurality of vacuum head means, a rotation shaft means secured to said head holder means for rotating said head holder means, a mounting frame means for supporting said rotation shaft means, and a head rotation drive mechanism for rotating said vacuum head means including a disk-shaped driven member mounted on each of said vacuum head means, and a disk-shaped drive member arranged in radial opposition to said driven member with a small gap therebetween to be rotated by a drive source, and magnets arranged on an outer peripheral portion of each of said driven member and said drive member with N poles and S poles being alternately disposed whereby said driven member and said drive member are magnetically coupled.

5. An electric parts mounting apparatus comprising a plurality of vacuum head means for taking up an electric part from a parts feeder and mounting said electric part on a parts support, a head holder means for rotatably supporting said plurality of vacuum head means, a rotation shaft means secured to said head holder means for rotating said head holder means, a mounting frame means for supporting said rotation shaft means, and a rotation drive mechanism for rotating said plurality of vacuum head means including a driven member attached to each of said vacuum head means on an opposite side thereof to a side thereof for taking up said electric parts, and a drive member, disposed in opposition to said driven member, rotated by a drive source, and connected to said driven member by a fluid force.

6. An electric parts mounting apparatus comprising a plurality of vacuum head means for taking up an electric part from a parts feeder and mounting said electric part on a parts support, a head holder means for rotatably supporting said plurality of vacuum head means, a rotation shaft means secured to said head holder means for rotating said head holder means, a mounting frame means for supporting said rotation shaft means, and a head rotation drive mechanism for rotating said vacuum head means including a rotating motor comprising a rotor mounted on said vacuum head means on an opposite side thereof to a side thereof taking up said electric parts, and a stator disposed in opposition to said rotor with a small gap.

7. An electric parts mounting apparatus comprising vacuum head means for taking up an electric part from a parts feeder and mounting said electric part on a parts support, a head holder means for rotatably supporting said vacuum head means, a rotation shaft means secured to said head holder means for rotating said head holder means, a mounting frame means for supporting said rotation shaft means, and a head rotation drive mechanism for rotating said vacuum head means including a rotating motor comprising a rotor mounted on each of said vacuum head means on an opposite side thereof to a side thereof taking up said electric parts, a stator disposed in opposition to said rotor with a small gap therebetween, wherein said rotor includes a rotating yoke and a plurality of magnets fixedly mounted on said yoke, said plurality of magnets being magnetized in a thickness direction and being annularly arranged so that adjacent parts of said magnets form magnetic poles, and wherein said stator includes a fixed yoke, a plurality of coils and entire ICs respectively annularly mounted on said fixed yoke of said stator.

8. An electric parts mounting apparatus comprising a plurality of vacuum head means for taking up an electric part from a parts feeder and mounting said electric part on a parts support, a head holder means for rotatably supporting said plurality of vacuum head means, a rotation shaft means secured to said head holder means for rotating said head holder means, a mounting frame means for supporting said rotation shaft means, and a head rotation drive mechanism for rotating said vacuum head means including a motor comprising a rotor mounted on each of said vacuum head means on an opposite side thereof to a side thereof taking up said electric parts, a stator disposed in opposition to a side face of said rotor with a small gap therebetween, wherein said rotor has a plurality of magnets arranged in a ring-state and in two steps in a vertical direction so that adjacent magnets are opposite in magnetic polarity to each other, wherein said stator includes two U-shaped poles opposed to upper and lower magnets of said plurality of magnets in a non-contact state.

9. An electric parts mounting apparatus comprising a plurality of vacuum head means for taking up an electric part at a taking-up station and mounting the electric part on a parts support at a mounting station, with each of said plurality of vacuum head means being rotated at a prescribed angle at a vacuum head rotation station between said taking up and mounting stations, a rotor for a rotating motor is secured to each of said vacuum head means, and a stator for the rotating motor is provided in said vacuum head rotation station disposed in opposition to said rotor in a non-contact state when said vacuum head means reaches said vacuum head rotation station, whereby each of said plurality of vacuum head means is rotated at said vacuum head rotation station.

10. An electric parts mounting apparatus comprising a plurality of vacuum head means intermittently moved in synchronism with each other along a prescribed path for taking up electric parts in turn at a parts taking up position and transferring the parts to a parts mounting position through a rotation of the vacuum head means effecting angular positioning of the electric parts, and a head rotation drive mechanism comprising a driven member provided on each of said vacuum head means, a drive member provided in a non-contact state with and in an adjacent relationship to said driven member, and means for magnetically connecting said driven member and said drive member whereby said angular positioning of each of said electric parts is effected by said head rotation drive mechanism.

11. An electric parts mounting apparatus comprising mounting means for taking up electric parts and mounting said electric parts on an electric parts support, a holding means for rotatably holding said mounting means, and a rotating means for rotating said mounting means including a driven means provided on said mounting means, and a drive means driven by a drive source magnetically connected to said driven means with a small gap therebetween.

12. A vacuum head rotation drive mechanism for an electric parts mounting apparatus, the rotation drive mechanism comprising a driven member mounted on a vacuum head means for taking up electric parts and mounting said electric parts on a parts support, and a drive member magnetically connected to said driven member with a small gap formed therebetween and rotated by a drive source.

13. An electric parts mounting method, the method comprising the steps of:
preparing a plurality of vacuum head means for taking up electric parts from a parts feeder and mounting the electric parts on a parts support;
preparing a head holder means for rotatably supporting the plurality of vacuum head means;
preparing a rotation shaft means for rotating the head holder means;
preparing a mounting frame means for supporting the rotation shaft means;
providing a driven member respectively drivingly connected to the vacuum head means on an opposite side of the vacuum head means to the side taking up the electric parts, and a driving member magnetically coupled to the driven member with a small gap therebetween;
rotating the vacuum head means relative to the head holder means by rotating the driving member to effect angular positioning of the electric parts; and
mounting the electric parts on the parts support.

14. An electric parts mounting method, the method comprising the steps of:
taking up electric parts from a parts feeder by a taking up head means;
magnetically connecting said taking up head means to a drive member for driving said taking up head means with a small gap between said taking up head means and said drive member;
effecting angular positioning of the electric parts taken up by said taking up head means through rotation of said taking up head means by said drive member; and
mounting said electric parts on said parts support.

15. An electric parts mounting apparatus according to one of claims 1, 3, 4, 5, 6, 7, 8, 9, 11 or 12 wherein said parts support includes a printed circuit board.

16. An electric parts mounting method according to one of claims 13 or 14, wherein said parts support includes a printed circuit board.

* * * * *